(12) United States Patent
Kurihara

(10) Patent No.: US 6,813,189 B2
(45) Date of Patent: Nov. 2, 2004

(54) SYSTEM FOR USING A DYNAMIC REFERENCE IN A DOUBLE-BIT CELL MEMORY

(75) Inventor: Kazuhiro Kurihara, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/197,116

(22) Filed: Jul. 16, 2002

(65) Prior Publication Data

US 2004/0012993 A1 Jan. 22, 2004

(51) Int. Cl.$^7$ .............................................. G11C 16/06
(52) U.S. Cl. ............................ 365/185.2; 365/185.21; 365/185.27; 365/185.03
(58) Field of Search ....................... 365/185.2, 185.21, 365/185.22, 185.03, 185.01

(56) References Cited

U.S. PATENT DOCUMENTS 6,373,767 B1 * 4/2002 Patti ............................ 365/210
6,490,203 B1 * 12/2002 Tang ....................... 365/185.22

* cited by examiner

*Primary Examiner*—Hoai Ho
(74) *Attorney, Agent, or Firm*—Sheppard Mullin Richter & Hampton LLP

(57) ABSTRACT

System for using a dynamic reference cell in a double-bit cell memory. A method is provided for reading and verifying a double bit core cell in a memory device. The memory device includes a dynamic reference cell and a fixed reference cell. The method comprises the steps of programming the dynamic reference cell using the fixed reference cell, and programming the double bit core cell using the dynamic reference cell. When the dynamic reference cell is located along with the core cell on the same word line, a constant current source added to a core cell data line operates during program verify to provide a current difference between the core cell and the dynamic reference cell.

8 Claims, 3 Drawing Sheets

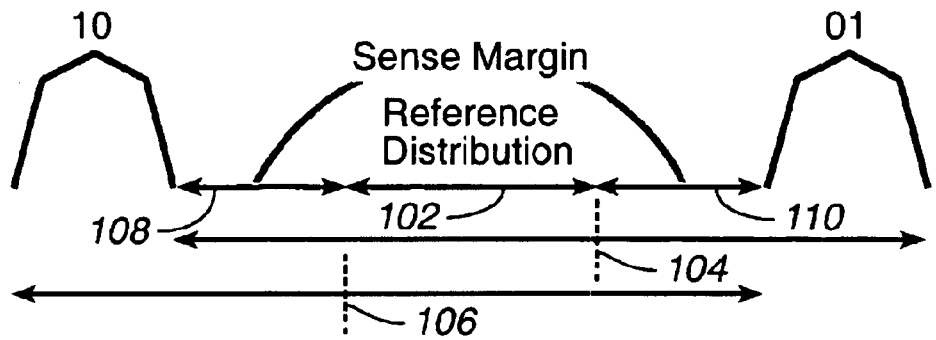
FIG._1
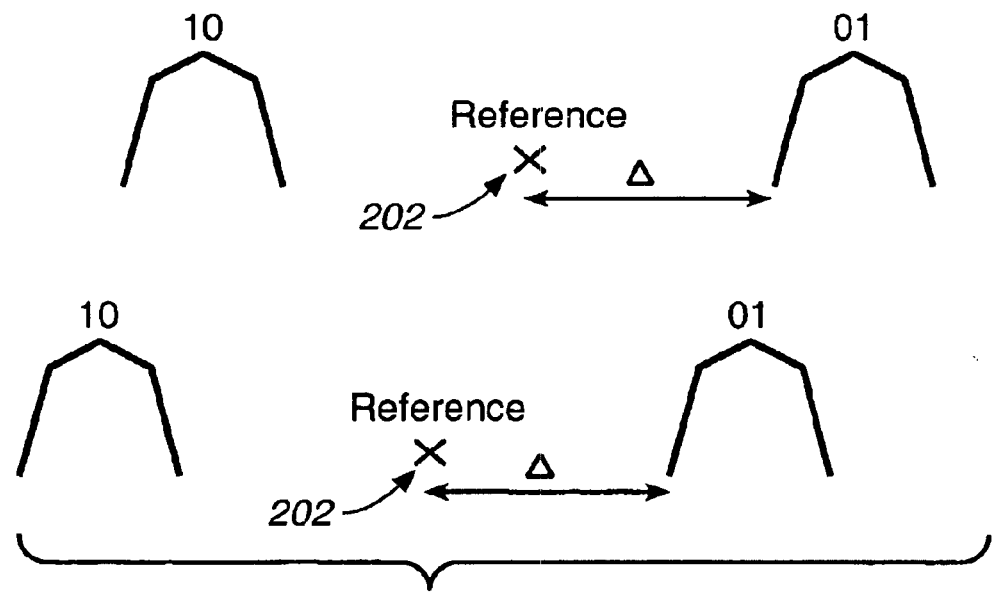
FIG._2

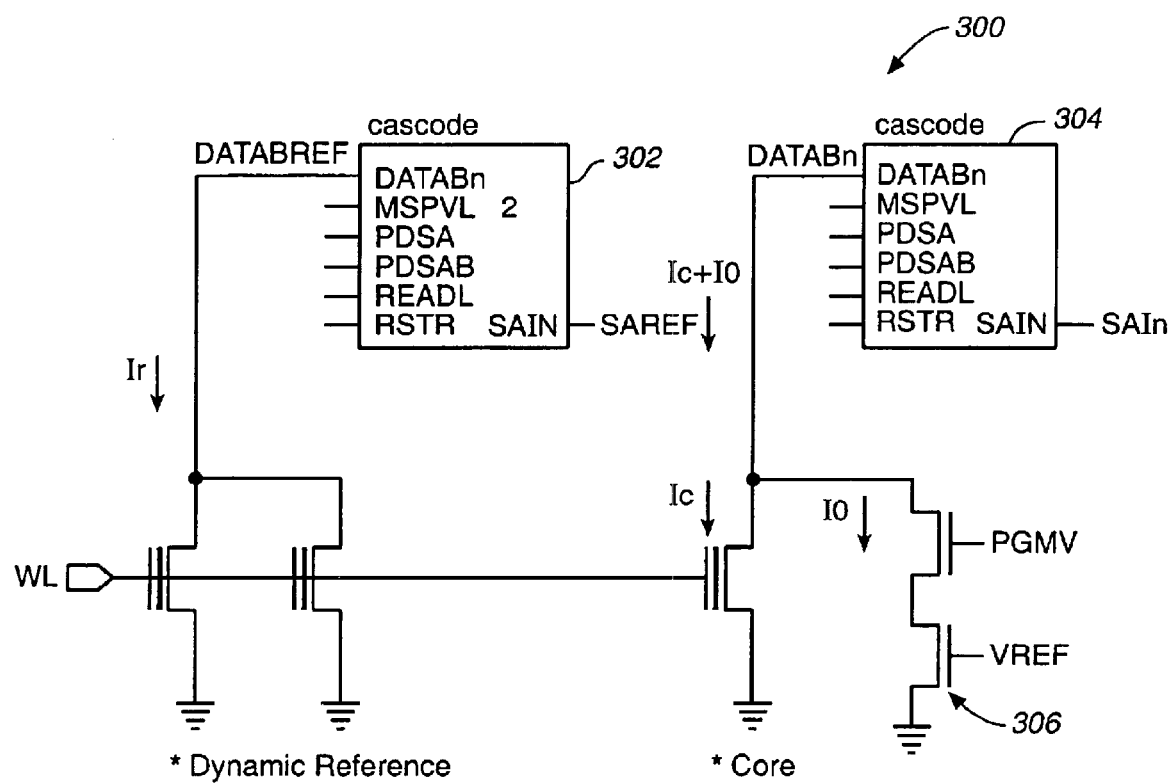
FIG._3

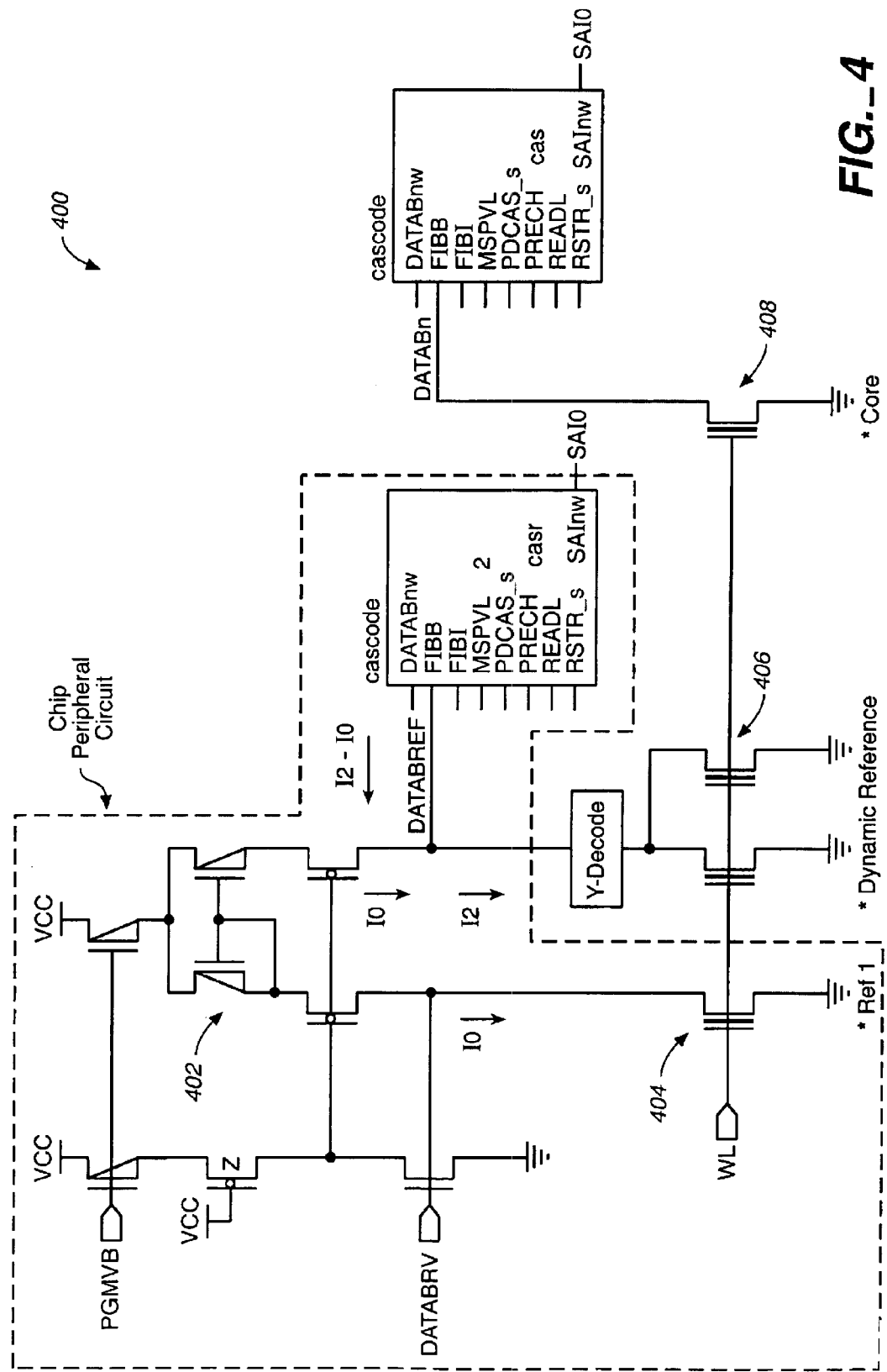
FIG._4

SYSTEM FOR USING A DYNAMIC REFERENCE IN A DOUBLE-BIT CELL MEMORY

FIELD OF THE INVENTION

The present invention relates to semiconductor memory devices, and more particularly, to a system for using a dynamic reference in a double-bit cell memory.

BACKGROUND OF THE INVENTION

Semiconductor devices, such as memory devices, are commonly used as information storage devices in digital systems. As the amount of information that needs to be stored increases, it has become increasingly important to have an efficient way of accessing such memory devices.

Generally, memory read or write operations are initiated in response to external signals provided to the memory by a controller, such as a processor. In most cases, the amount of information that needs to be transferred during a memory access is large. In addition, the rate at which the information is propagated from a processor to a memory device and vice versa continues to increase. Therefore, increasing performance demands are being placed on the ability to read and write information to memory devices.

In one type of FLASH memory architecture, referred to as "mirror bit" or "double bit" FLASH memory, there are two data bits stored at each core memory cell. During operation of the memory, reference cells are used to perform various memory functions. For example, there is a dynamic reference read method where an average of voltage threshold (Vt) values for data 01 and data 10 is used to program the reference cells, which are programmed and erased along with the core cells in a memory sector. Because data 01 and 10 have a Vt distribution, the associated reference cells will have Vt distribution as well. If the data 01 and 10 Vt distributions are wide, the reference cell Vt distribution becomes wide, and as a result, operational margins between the reference cell and the data 01 and data 10 will be greatly reduced.

FIG. 1 illustrates how reference Vt distributions are determined in a conventional mirror bit memory where reference cells are placed in the core memory array area. Because core cell data 10 and 01 have wide Vt distributions, the Vt distribution for the reference cell is also wide, as shown at 102. For example, the center line 104 indicates the center of one range of distribution for data 10 and 01 Vt values, and the center line 106 indicates the center of another range of distribution for data 10 and 01 Vt values. As a result, the wide Vt distribution shown at 102 will result. As the reference cell Vt distribution becomes wider, the sense margin regions 108, 110 become smaller. Thus, as the sense margin decreases, memory read errors increase, and so the performance of the memory decreases.

Therefore, it would be desirable to have a way to set the voltage thresholds of reference cells in a core array to achieve the optimal sense margins for the best memory performance.

SUMMARY OF THE INVENTION

The present invention includes a system for using a dynamic reference cell with core cells in a dual-bit memory device. The system includes a method for programming the dynamic reference cell in order to provide the optimal sense margin between the Vt of the dynamic reference and the Vt of the data "10" or "01" core cell values during read operations. The system includes method and apparatus for reading the core cells based on the dynamic reference.

In one embodiment of the present invention, a method is provided for programming a double bit core cell in a memory device. The memory device includes a dynamic reference cell and a fixed reference cell. The method comprises the steps of programming the dynamic reference cell using the fixed reference cell, and programming the double bit core cell using the dynamic reference cell.

In one embodiment of the present invention, apparatus is provided for programming a double bit core cell in a memory device, wherein the memory device includes a fixed reference cell. The apparatus comprises a dynamic reference cell that is programmed based on the fixed reference cell, and wherein the double bit cell is programmed based on the dynamic reference cell. The apparatus also comprises a current circuit that adjusts a core cell current to provide a current difference between the core cell and the dynamic reference cell during a program verify operation.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1 shows a diagram of a Vt distribution for a conventional mirror bit memory that uses a dynamic reference cell;

FIG. 2 shows a diagram of a Vt distribution for a mirror bit memory that uses a dynamic reference in accordance with the present invention;

FIG. 3 shows a diagram for one embodiment of a system for using a dynamic reference constructed in accordance with the present invention; and FIG. 4 shows a diagram for another embodiment of a system for using a dynamic reference constructed in accordance with the present invention.

DETAILED DESCRIPTION OF THE INVENTION

The present invention includes a system for using a dynamic reference in a dual-bit core cell to provide optimal read margins with which to operate the memory.
Exemplary Embodiment FIG. 2 shows how a dual-bit core cell is programmed using a dynamic reference cell in accordance with the present invention. As shown in FIG. 2, as the Vt of the reference cell 202 is programmed to different values, and as a result, the core cell data is programmed to maintain a selected threshold difference (sense margin), shown as Δ. Thus, it is possible to read the memory without errors and maintain an excellent sense margin.

In one embodiment of the invention, the dynamic reference cell is programmed using a fixed reference that is located outside the core memory area. For example, the memory device includes a memory area that contains the core cells and the reference cells, and a peripheral area that contains additional memory circuitry, such as the fixed reference cell. The fixed reference can be programmed only once at the manufacturer so that its Vt value is stable over time. The fixed reference is then used to program the dynamic reference, which in turn, is used to program core cells in the memory array. Thus, the following steps can be performed in accordance with the present invention.

1. Program the fixed reference during memory device manufacture.
2. During operation of the memory device, program the dynamic reference cells using the fixed reference.
3. During operation of the memory device, program the memory core cells using the dynamic reference cells.

FIG. 3 shows a diagram for one embodiment of a system 300 for using a dynamic reference constructed in accordance with the present invention. The system 300 shows current to voltage converters 302, 304 that detect reference cell and core cell currents to produce corresponding voltages that are detected by a sense amplifier (not shown). In a situation where the dynamic reference cell is located with a core cell and uses the same word line as the core cell, it is not possible to provide different gate voltage between core and dynamic reference.

In such a situation, a constant current source 306 is added on the core cell DATAB lines during program verify. This provides a current difference between the core cell current and the dynamic reference current that is used during the program verify operation. In one embodiment included in the present invention, the constant current source is provided by adding a pull-down on a VREF gated N-channel transistor coupled to the core cell. However, any other technique for providing a constant current source can be used in accordance with the invention. As a result, the reference current (Ir) input to the converter 302 is less (or more) than the core cell current (Ic+I0) input to the converter 304. This current difference provides the different programming levels between the reference and core cell during program verify.

FIG. 4 shows a diagram for one embodiment of a system 400 for using a dynamic reference constructed in accordance with the present invention. The system 400 operates to provide a delta Vt between reference and core cells in accordance with the present invention. As shown in FIG. 4, a constant current source provided by a current mirror circuit 402 is added on a DATABREF line, using an external reference 404, where its associated Vt can be set accurately during wafer sort of the manufacturing process.

In the implementation shown in embodiment 400, the current mirror circuit 402 and the fixed reference cell 404 are provided in a chip peripheral circuit located outside the core memory array of the device. The dynamic reference 406 is provided in the memory array with the core cell 408. Thus, it is possible to program the dynamic reference 406 using the fixed reference 404, and then program the core cell 408 using the dynamic reference. As a result, the desired sense margins are maintained during the read and verify operations.

The present invention includes a system for using a dynamic reference in a dual-bit core cell in a memory device. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A method for programming a double bit core cell in a memory device, wherein the memory device includes a dynamic reference cell and a fixed reference cell, the method comprising steps of:

a first programming step including programming the dynamic reference cell based on the fixed reference cell; and a second programming step including programming the double bit core cell based on the dynamic reference cell, wherein the second programming step comprises verifying the programming operation by adjusting a core cell current to provide a current difference between the double bit core cell and the dynamic reference cell.

2. The method of claim 1, wherein the second programming step comprises verifying the programming operation using a constant current source added on a data line of the double bit core cell to provide the current difference between the double bit core cell and the dynamic reference cell.

3. The method of claim 1, wherein the second programming step comprises verifying the programming operation using a current source added on a data line of the dynamic reference cell to provide the current difference between the double bit core cell and the dynamic reference cell.

4. The method of claim 1, wherein the second programming step comprises verifying the programming operation using a current mirror circuit coupled to the fixed reference cell as a current source added on a data line of the dynamic reference cell to provide the current difference between the double bit core cell and the dynamic reference cell.

5. Apparatus for programming a double bit core cell in a memory device, wherein the memory device includes a fixed reference cell, the apparatus comprising:

a dynamic reference cell that is programmed based on the fixed reference cell, wherein the double bit cell is programmed based on the dynamic reference cell; and a current circuit that adjusts a core cell current to provide a current difference between the double bit core cell and the dynamic reference cell during a program verify operation of the double bit core cell.

6. The apparatus of claim 5, wherein the current circuit comprises a constant current source coupled to a core cell data line to provide the current difference between the core cell and the dynamic reference cell during the program verify operation.

7. The apparatus of claim 5, wherein the current circuit comprises a constant current source coupled to a data line of the dynamic reference cell to provide the current difference between the core cell and the dynamic reference cell during the program verify operation.

8. The apparatus of claim 7, wherein the constant current source comprises a current mirror circuit.

* * * * *